United States Patent
Beall et al.

(10) Patent No.: US 10,631,440 B1
(45) Date of Patent: Apr. 21, 2020

(54) SERVER CHASSIS WITH COMPOSITE WALL

(71) Applicant: Amazon Technologies, Inc., Seattle, WA (US)

(72) Inventors: Christopher Strickland Beall, Woodinville, WA (US); Felipe Enrique Ortega Gutierrez, Tacoma, WA (US); Roey Rivnay, Seattle, WA (US)

(73) Assignee: Amazon Technologies, Inc., Seattle, WA (US)

(*) Notice: Subject to any disclaimer, the term of this patent is extended or adjusted under 35 U.S.C. 154(b) by 289 days.

(21) Appl. No.: 15/166,014

(22) Filed: May 26, 2016

(51) Int. Cl.
*H05K 7/20* (2006.01)
*H05K 7/14* (2006.01)

(52) U.S. Cl.
CPC ....... *H05K 7/20709* (2013.01); *H05K 7/1488* (2013.01)

(58) Field of Classification Search
CPC .... H05K 7/20709; H05K 7/1488; H05K 7/14; H05K 7/20727; H05K 7/20736; H05K 7/20772; H05K 7/20781; H05K 7/20809; H05K 7/20818; H05K 7/20836; H05K 7/20454; H05K 7/1489; G06F 1/20; G06F 1/206
USPC ....................................... 454/184; 312/223.2
See application file for complete search history.

(56) References Cited

U.S. PATENT DOCUMENTS

| 9,363,926 | B1  | 6/2016 | Bryan et al. |
| 2012/0069514 | A1* | 3/2012 | Ross ................... H05K 7/20727 361/679.33 |
| 2015/0036284 | A1* | 2/2015 | Ross ........................ G06F 1/20 361/679.46 |
| 2015/0062799 | A1* | 3/2015 | Wei ..................... H05K 7/20736 361/679.33 |

OTHER PUBLICATIONS

U.S. Appl. No. 15/058,103, filed Mar. 1, 2016, Darin Lee Frink, et al.
U.S. Appl. No. 15/087,746, filed Mar. 31, 2016, Roey Rivnay, et al.
U.S. Appl. No. 14/217,124, filed Mar. 17, 2014, Christopher Strickland Beall, et al.
U.S. Appl. No. 14/217,121, filed Mar. 17, 2014, David Edward Bryan, et al.

* cited by examiner

*Primary Examiner* — Grant Moubry
*Assistant Examiner* — Ryan L Faulkner
(74) *Attorney, Agent, or Firm* — Robert C. Kowert; Kowert, Hood, Munyon, Rankin & Goetzel, P.C.

(57) ABSTRACT

A server system includes a server chassis with one or more composite walls that provide structural stiffness for the server chassis. The one or more composite walls also include one or more air passages that permit air to flow through the composite walls. Each composite wall comprises at least two plates and one or more spacing devices that separate the at least two plates. Air passages are included in the composite wall between the at least two plates separated by the spacing devices and one or more openings permit air flowing through the air passages of the composite wall to flow out of the composite wall and across server devices mounted in the server chassis that includes the composite wall.

20 Claims, 7 Drawing Sheets

SERVER CHASSIS WITH COMPOSITE WALL

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Server systems typically include a number of components, such components include printed circuit boards, mass storage devices, power supplies, and processors. Some known server systems include a plurality of large, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some server systems include components such as printed circuit boards, mass storage devices, power supplies, or processors mounted in a chassis that is configured to mount in a rack, such as one of the rack-systems described above. In order to provide a sufficiently stiff structure, such server chassis may include various combinations of structural members. For example, some server chassis may include ribs, forms, thick plates, or other types of structural members. Such structural members may stiffen a server chassis, but may also impede or block air flow through the server chassis.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of server systems with composite walls, and systems and methods for cooling components in server systems with composite walls, are disclosed. According to one embodiment, a server system includes a server chassis comprising multiple chassis walls. The server system includes sleds mounted in the server chassis and server devices mounted in respective ones of the sleds. For example, server devices such as hard disk drives, printed circuit boards, motherboards, power supplies, and other server components may be mounted in respective sleds that are configured to slide into and out of a chassis of a server system. The server chassis includes at least one composite wall that includes at least two plates, a spacing device between adjacent ones of the at least two plates, and an air passage between the adjacent ones of the plates. The server chassis is configured to permit air to flow from an air inlet side of the server chassis to server devices mounted in sleds mounted in the server chassis via an air passage of at least one of the composite walls of the server chassis. For example, a top wall, bottom wall, or other wall of a server chassis may be a composite wall. In some embodiments, a first composite wall of a server chassis may include an air passage that permits air to flow through the first composite wall from an air inlet side of the server chassis to server devices mounted in the server chassis, and a second composite wall of the server chassis may include an additional air passage that permits air that has passed across the server devices mounted in the server chassis to flow from the server devices to an outlet side of the server chassis.

According to one embodiment, an apparatus includes a server chassis comprising multiple walls. For example, a server chassis may include a top wall, a bottom wall, a back wall, and side walls. At least one of the walls of the multiple walls of the server chassis may be a composite wall that includes at least two plates, a spacing device between the at least two plates, and an air passage between the at least two plates.

According to one embodiment, a method includes mounting a server chassis in a rack computer system, wherein the server chassis includes at least one composite wall comprising two plates, a spacing device between the two plates, and an air passage between the at least two plates.

As used herein, "backplane" means a plate or board to which other electronic components, such as mass storage devices, server devices, etc. can be mounted. In some embodiments, mass storage devices, which can include one or more hard disk drives, are plugged into a backplane in a generally perpendicular orientation relative to the face of the backplane. In some embodiments, a server device is plugged into a backplane in a generally perpendicular orientation relative to the face of the backplane. In some embodiments, a backplane includes one or more power buses that can transmit power to components on the backplane, and one or more data buses that can transmit data to and from components installed on the backplane. In some embodiments, components that collectively function as a server device may be separately mounted on a backplane.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. In one embodiment, a chassis is made from one or more sheet metal parts. A chassis for a server system may support circuit board assemblies, power supply units, data storage devices, fans, cables, and other components of the server system.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. The mounted particular element may be positioned to rest upon one or more upper surfaces of the other element, independent of coupling the elements via one or more coupling elements. In some embodiments, mounting the particular element to another element includes coupling the elements such that the other element provides one or more of structural support, positioning, structural load transfer, stabilization, shock absorption, some combination thereof, or the like with regard to the particular element.

As used herein, a "plate" means a thin piece of material with a thickness that is relatively small compared to a length and/or width of the plate. For example, in some embodiments, a plate may be a piece of sheet metal. In some embodiments, a plate may be made out of any suitable material.

As used herein, a "rack" means a rack, container, frame, or other element or combination of elements that can contain or physically support one or more computer systems. In some embodiments a rack is a standard 19" rack that conforms to electronic industries alliance (EIA) standards.

As used herein a "wall" means a side of a structure or a divider within a structure. For example a wall of a server chassis may be a front wall, a back wall, a side wall, a top wall, a bottom wall, or an intermediary wall. In some embodiments, a server chassis may not include walls on each side of a structure of the server chassis. For example, in some embodiments, a server chassis may not include a front wall.

Some server systems that mount in a rack may be general purpose servers, while some rack-mounted servers may be specially designed for storage capacity or compute capacity. Server systems may include server devices such as hard disk drives and/or printed circuit boards along with other server components such as power supplies, heat sinks, and/or additional components mounted on sleds configured to slide into and out of a server chassis of the server system. Server devices and server components of a server system may generate waste heat and may be cooled by air that flows through the server chassis and across the server devices and server components. Air flowing across the server devices and server components may remove waste heat from the server devices and server components. Also, in some embodiments, several such server devices and/or server components may be mounted in sleds. Such sleds comprising multiple server devices and server components may collectively have a considerable weight. In some embodiments, a sled of a server system fully filled with server devices mounted in the sled may weigh 50 lbs. or more. The weight of server devices and server components mounted in sleds of a server system may cause walls of a server chassis of the server system, such as a bottom wall of a server chassis, to sag. Also, some server chassis may sag even further when a sled is removed from the server chassis due to a loss of added stiffness that results from sleds pushing against one another when the server chassis is fully filled with sleds mounted in the server chassis.

Increasing material thicknesses of server chassis members, such as server chassis walls may increase the stiffness of the server chassis and reduce sagging. For example, increasing a thickness of a bottom wall of a server chassis may improve the stiffness of the server chassis. However, increasing a thickness of one or more server chassis members, such as a server chassis wall, may also reduce space available in the server chassis for air to flow through the server chassis to cool server devices mounted in the server chassis. In some cases, adding intermediate structural bracing such as ribs or forms may improve stiffness of a server chassis. However, such intermediate bracing may also impinge or block air flow through a server chassis and result in less efficient cooling of server devices and server components mounted in the server chassis.

In some embodiments, a composite wall may be included in a server chassis to improve a stiffness of the server chassis while also providing one or more air passages for air to flow through the server chassis. In some embodiments, air may flow through an air passage of a composite wall from an air inlet side of a server chassis to server devices mounted in the server chassis. In some embodiments, an additional composite wall of a server chassis may allow air that has passed across server devices mounted in the server chassis to flow from the server devices to an air outlet side of the server chassis via air passages of the additional composite wall. Thus, including one or more composite walls in a server chassis may increase stiffness of the server chassis while still providing air passages for airflow through the server chassis.

A composite wall may include at least two plates and one or more spacing devices between adjacent ones of the at least two plates. The spacing devices may occupy only a portion of a space between adjacent plates thus leaving additional space between the adjacent plates unoccupied and available for use as one or more air passages between the adjacent plates. Due to separating adjacent plates with one or more spacing devices, a moment of inertia of the composite wall may be greater than a moment of inertia of the two plates individually or greater than a moment of inertia of a comparable plate with an equivalent thickness as thick as the sum of the thicknesses of the two plates. For example, the moment of Inertia about an axis running through a rectangular structural member is given by the equation $$I = \frac{1}{12}bh^3,$$

where I=the moment of inertia of the rectangular structural member, b=the width of the base of the structural member, and h=the height of the structural member. As can be seen in this example equation, the height (h) of the structural member has a cubic relationship to the moment of inertia of the structural member. In addition and continuing the example, the deflection of a simply supported structural member, may be inversely proportional to the moment of inertia of the structural member (meaning that as the moment of inertia of a structural member is increased, the maximum deflection of the structural member when similarly loaded decreases in proportion to the increase in the moment of inertia of the structural member).

For example, for a simply supported beam with a distributed load, the maximum deflection of the beam is given by the equation $$\text{Max Deflection} = \frac{5wL^4}{384EI},$$

where w=a distributed load, L=the length of the simply supported beam, E=the modulus of elasticity of the material that makes up the simply supported beam, and I=the moment of inertia of the simply supported beam. As can be seen, increasing the moment of inertia of the structural member (I) will result in less deflection of the structural member under the same loading conditions (w). Also, as can be seen, increasing the height (h) of a structural member exponentially increases the moment of inertia (I) of the structural member. Said another way, increasing the height of a wall of a server chassis by including one or more spacing devices between two plates of a composite wall may have a greater impact on the stiffness of a server chassis (e.g. measured by deflection under a given set of loading conditions) than increasing a thickness of one of the server walls by adding an additional plate or may have a greater impact on stiffness of a server chassis than adding additional intermediate structural bracing such as ribs or forms. Note that the equations given above are given only as examples to illustrate an effect of increasing moment of inertia of a server chassis wall, by including a composite wall, on deflection of the server chassis wall when loaded. In some embodiments, a composite wall may have various shapes other than a rectangular shape as described in the example above and to which the above equations pertain. Also a composite server chassis wall may be supported in different ways. For example a composite server chassis wall may be supported in a way other than simply supported.

Figures 1A, 1B, 1C:
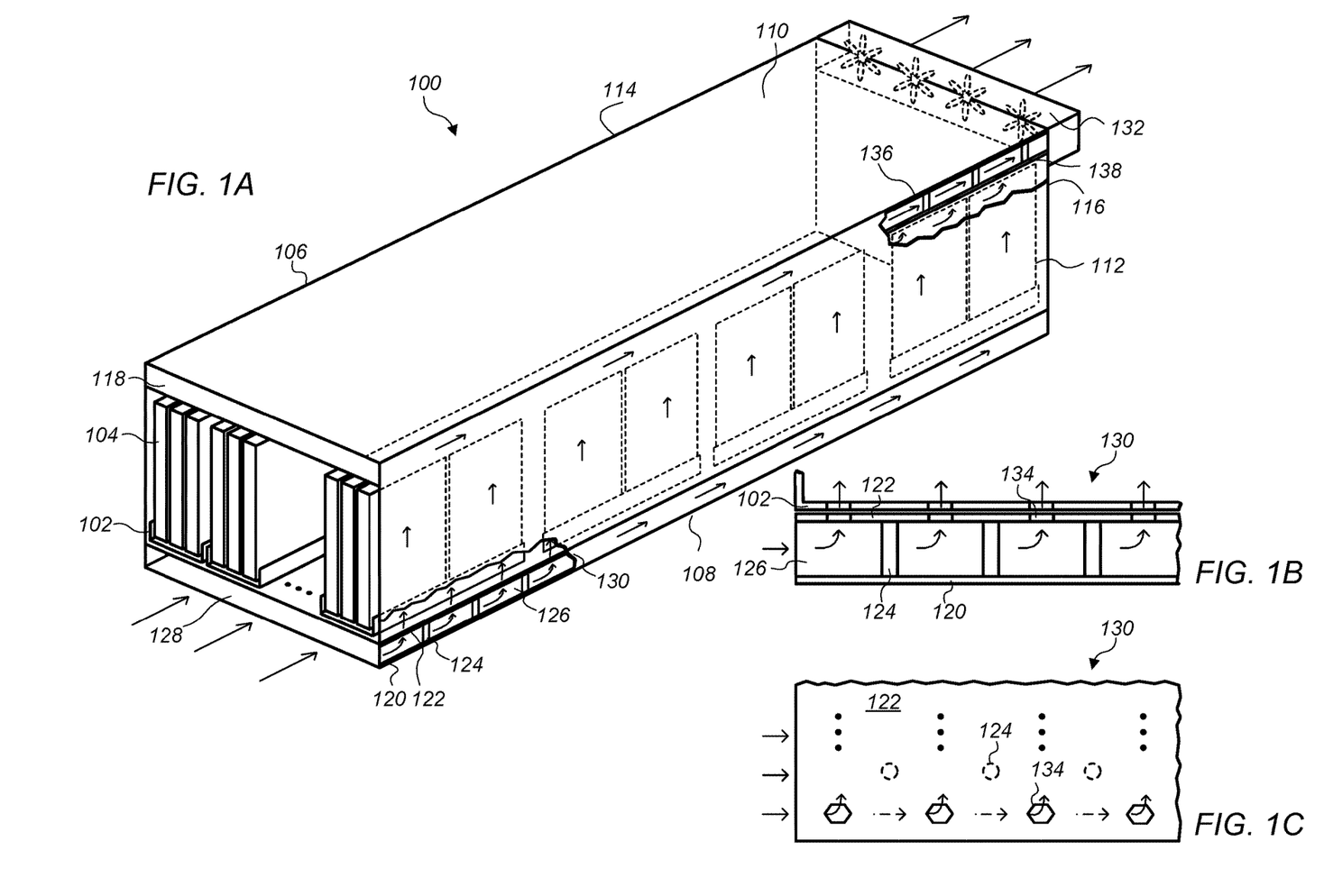
FIG. 1A is a perspective view illustrating a server system with a server chassis comprising a bottom composite wall and a top composite wall, according to some embodiments.
FIG. 1B is a side view of a cut-away portion of a composite wall of a server chassis, according to some embodiments.
FIG. 1C is a top view of a cut-away portion of a composite wall of a server chassis, according to some embodiments.

FIG. 1A is a perspective view illustrating a server system with a server chassis comprising a bottom composite wall and a top composite wall, according to some embodiments. Server system 100 includes server chassis 106 with sleds 102 mounted in server chassis 106 and server devices 104 mounted in sleds 102. Server chassis 106 includes bottom wall 108, top wall 110, side wall 112, side wall 114, and back wall 116. In some embodiments, a server chassis, such as server chassis 106, may not include a front wall and may be open on a front side of the server chassis. For example, server chassis 106 is open at front end 118. In some embodiments, a server chassis, such as server chassis 106 may include a front cover (not shown) at a front end of the server chassis, such as front end 118. For example, a door, gate, panel, etc. may be attached to a front side of a server chassis to allow access to server devices mounted in the server chassis. The door, gate, panel, etc. may be configured to close when access to server devices mounted in the server chassis is not needed.

FIG. 1A illustrates server devices mounted in sleds, however in some embodiments server devices may be mounted in a server chassis without using sleds. For example, in some embodiments, server devices may be mounted directly on a bottom wall of a server chassis, may be mounted in a server chassis via one or more rails, or may be mounted in a server chassis via other suitable means.

In some embodiments, server devices may include mass storage devices, such as hard disk drives. In some embodiments server devices may include circuit board assemblies that perform processing functions. In some embodiments a server system may include mass storage server devices and processor server devices. In addition, in some embodiments, a server system may include additional server components mounted in a server chassis such as power supplies, network switches, and other electronic components. In some embodiments a sled configured to mount in a server chassis may include mass storage server devices, processor server devices, and additional server components, such as power supplies, heat sinks, network switches, etc. mounted in the sled.

Server devices mounted in a server chassis may have a considerable weight that is supported by walls of the server chassis, such as a bottom wall or top wall of a server chassis. In some cases, a weight of server devices and server components mounted in a server chassis may cause a wall of the server chassis, such as a bottom wall of the server chassis, to sag. In order to avoid sagging caused by supporting heavy server devices and server components, a server chassis may include one or more composite walls that add stiffness to the structure of the server chassis. For example, bottom wall 108 of server chassis 106 is a composite wall and top wall 110 of server chassis 106 is a composite wall.

A composite wall may include multiple plates that are separated by spacing devices. For example bottom wall 108 includes plate 120 and plate 122 that are separated by spacing devices 124. In addition, a composite wall may include one or more air passages through the composite wall that permit air to flow from an inlet side of a server chassis to server devices and server components mounted in the server chassis. For example, server chassis 106 includes air passages 126. Air passages 126 extend from air inlet 128 of server chassis 106 to back wall 116 of server chassis 106 and are located beneath server devices 104 mounted in server chassis 106. In some embodiments, air passages of a composite wall, such as air passages 126 may extend a full length and/or a full width of a server chassis or may extend through only a partial length or a partial width of a server chassis.

FIG. 1B is a side view of a cut-away portion of a composite wall of a server chassis, according to some embodiments. Portion 130 of bottom composite wall 108 and sled 102 illustrated in FIG. 1B may be the same as portion 130 of bottom composite wall 108 and sled 102 illustrated in the cutaway view shown in FIG. 1A. In addition, FIG. 1C illustrates a top view of a cut-away portion of a composite wall of a server chassis, according to some embodiments. Portion 130 illustrated in FIG. 1C may be a top view of a corresponding portion of bottom composite wall 108 that corresponds to the portion illustrated in a side view in FIG. 1B.

Air may be drawn into a composite wall via an air inlet side of a server chassis. One or more fans coupled with a server chassis may lower a pressure in a server chassis in relation to a pressure external to the server chassis causing air to be drawn into the server chassis. For example, fans 132 are coupled with server chassis 106 at back wall 116. Fans, such as fans 132, may lower a pressure in server chassis 106 causing air to be drawn into the server chassis. Air may be drawn into a server chassis, such as server chassis 106, via one or more air inlets, such as air inlets 128. In some embodiments, air inlets of a server chassis, such as air inlets 128, may be in fluid communication with one or more air passages of a composite wall of the server chassis. For example, air inlets 128 are in fluid communication with air passages 126 of bottom composite wall 108. In some embodiments, a composite wall, such as bottom composite wall 108, may include one or more openings that permit air flowing through air passages of the composite wall to flow out of the air passages of the composite wall and to flow across server devices mounted in a server chassis that includes the composite wall. For example, as illustrated in FIG. 1B, plate 122 of bottom composite wall 108 includes openings 134. Air flowing through air passages 126 of bottom composite wall 108 may flow out of bottom composite wall 108 via openings 134 and may flow across server devices, such as server devices 104, mounted in a server chassis that includes bottom composite wall 108. In some embodiments, a plate of a composite wall, such as plate 122, may include multiple openings that are configured to align with openings in sleds, such as sled 102, mounted in a server chassis above a composite wall. For example, as shown in FIG. 1C, plate 122 includes multiple openings 134.

In some embodiments, multiple spacing devices may be located between plates of a composite wall to separate the plates of the composite wall. For example, as shown in FIG. 1C, bottom composite wall 108 includes multiple spacing devices 124.

In some embodiments, a server chassis may include multiple composite walls. For example, server chassis 106 in addition to bottom composite wall 108 also includes top composite wall 110. In some embodiments, air may flow over server devices mounted in a server chassis and may subsequently flow into one or more air passages of a composite wall, such as top composite wall 110. The air may then flow through the composite wall via air passages of the composite wall to an air outlet side of a server chassis. For example, after passing over server devices 104, air may be drawn into air passages 136 of top composite wall 110 and expelled from server chassis 106 via fans 132.

In some embodiments, fans, such as fans 132, may be mounted on a server chassis, such as server chassis 106. In some embodiments, fans, such as fans 132, may be included in a rack in which a server chassis, such as server chassis 106, is mounted, but may not be directly coupled to the server chassis. Also, in some embodiments, air flow through a server chassis may be induced via other means. For example, in some embodiments a central or common air system for a rack or group of racks may cause air to flow through a server chassis, such as server chassis 106, without fans being mounted on the server chassis or without fans being included in a particular rack in which the server chassis is mounted.

In some embodiments, a server chassis may be a single chassis that is configured to mount in a single rack slot or a server chassis may span multiple rack slots. For example, a server chassis may occupy one or more slots in a rack. In some embodiments, a height of a server system that includes a server chassis with composite walls may span multiple 1 U slots in a standard 19" EIA rack. For example, a server system may have a height of 1 U, 2 U, 3 U, 4 U, 5 U, 1.5 U, 2.5 U, etc.

Also, as shown in FIG. 1C, spacing devices of a composite wall, such as spacing devices 124, may be arranged such that the spacing devices do not block or impinge air flow through a composite wall. For example, air flowing beneath openings 134 shown in FIG. 1C is not blocked or impinged by spacing devices 124, because spacing devices 124 are located outside of a flow path of air flowing to openings 134. Also, as shown in FIG. 1B, a composite wall, such as bottom composite wall 108, may include air passages that span a full height from a top surface of a bottom plate of the composite wall to a bottom surface of a top plate of the composite wall. For example, air passage 126 spans from the top surface of plate 120 to the bottom surface of plate 122 without obstructions between the two plates. An unobstructed air passage, such as air passage 126, may allow a considerable amount of air to flow through a composite wall despite a relatively short distance separating plates of a composite wall.

In some embodiments that include multiple composite walls, an upper composite wall may extend down in a server chassis to a top of server devices mounted in the server chassis. For example, in some embodiments, top composite wall 110 may extend down into server chassis 106 such that plate 138 of top composite wall 110 is adjacent to or in contact with a top side of server devices 104 mounted in server chassis 106. In some embodiments, a server chassis may include an air gap between a top side of server devices, such as server devices 104, and a top composite wall, such as top composite wall 110. In some embodiments, a server chassis may include a single composite wall, such as either top composite wall 110 or bottom composite wall 108. In such embodiments, a server chassis may include an air gap above or below server devices on an opposite side of the server chassis from the composite wall to allow air flow through the server chassis.

In some embodiments, multiple components that function as a server device may be mounted on a backplane included in at least one sled of a server system. In some embodiments, a server device may be a separate device that plugs into a connector on a backplane included in a sled. A server device, such as one of server devices 104, may include one or more network ports and be configured to communicate with systems outside of server system 100. For example, a server device 104 may be configured to receive read and write requests from other computing systems and/or servers to read data from and write data to server devices 104 that are mass storage devices.

Figure 2A:
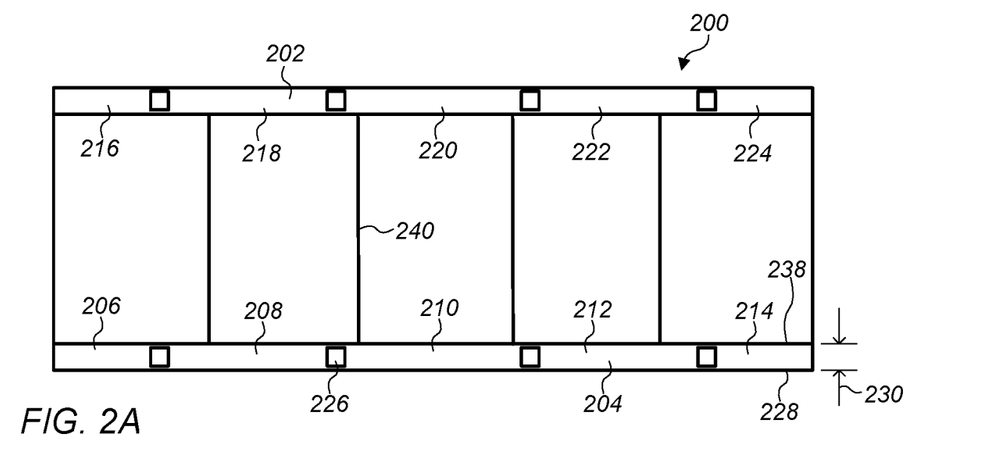
FIG. 2A is a front view of a server chassis comprising a top composite wall and a bottom composite wall, according to some embodiments.
Figure 2B:
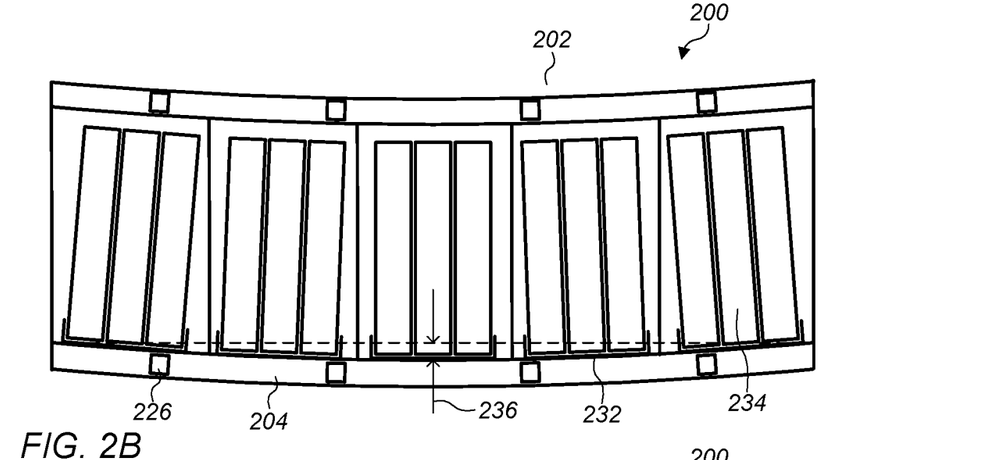
FIG. 2B is a front view of server devices mounted in a server chassis comprising a top composite wall and a bottom composite wall, according to some embodiments.
Figure 2C:
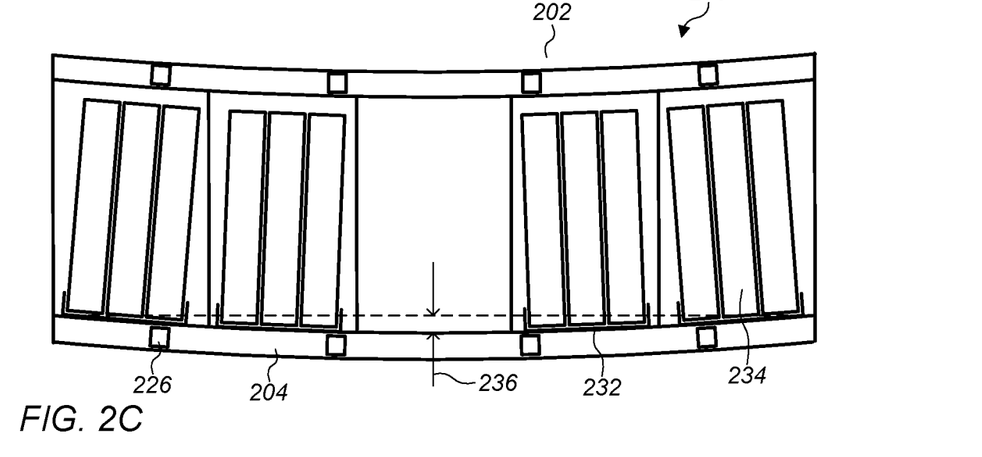
FIG. 2C is a front view of server devices mounted in a server chassis comprising a top composite wall and a bottom composite wall, according to some embodiments.

FIGS. 2A-C illustrate a front view of a server chassis comprising a top composite wall and a bottom composite wall, according to some embodiments. Server chassis 200 illustrated in FIGS. 2A-2C may be the same as server chassis 106 described in regard to FIGS. 1A-1C. Server chassis 200 includes top composite wall 202 and bottom composite wall 204. Bottom composite wall 204 includes air passages 206, 208, 210, 212, and 214 between spacing devices 226. Top composite wall 202 includes air passages 216, 218, 220, 222, and 224 between spacing devices 226. As can be seen in FIG. 2A, in some embodiments, air passages, such as air passages 206, 208, 210, 212, 214, 216, 218, 220, 224, may span a full height, such as height 230, between plates of a composite wall, such as plates of bottom composite wall 204. In some embodiments, a server chassis, such as server chassis 200, may include supports located between spaces in the server chassis for accepting sleds. For example, server chassis 200 includes supports 240 that connect bottom composite wall 204 such that a portion of a load supported by bottom composite wall 204 is transmitted to top composite wall 202 via supports 240.

FIG. 2B illustrates server chassis 200 with sleds 232 mounted in server chassis 200. Each of sleds 232 includes multiple server devices 234. A composite wall, such as composite walls 202 and 204, may increase a stiffness of a server chassis, such as server chassis 200, in comparison to a server chassis that does not include composite walls. An amount of deflection of a server chassis that includes composite walls, when loaded with sleds of server devices, may be less than a similar server chassis that does not include composite walls. For example, server chassis 200 may deflect distance 236 when loaded with sleds 232 including server devices 234. This may be a shorter distance than a distance of deflection of a similar server chassis that does not include composite walls. In some embodiments, a server chassis, such as server chassis 200, may not deflect further than a threshold distance when fully loaded with sleds of server devices, such that the deflection of the server chassis does not interfere with adjacent server systems mounted in a common rack with the server system. For example, distance 236 may not to exceed a threshold amount of deflection. In addition, a threshold amount of acceptable deflection of a server chassis composite wall may ensure that a sufficient clearance between supports and server devices mounted in sleds is maintained such that the server devices and the supports do not touch each other. For example, composite walls 202 and 204 may be designed to not deflect more than a threshold amount such that the top edges of the server devices 234 due not touch or impinge upon supports 240 between sleds 232 of server devices 234.

FIG. 2C illustrates server chassis 200 with at least one sled removed from the server chassis. In some embodiments, a server chassis may not to deflect more than a threshold distance when at least one sled is removed from the server chassis. In some embodiments, the threshold distance of deflection for a fully loaded (e.g. fully filled with sleds) server chassis and a partially loaded server chassis (e.g. at least one sled removed) may be the same threshold distance. In some embodiments, removing a sled from a server chassis may result in slightly greater deflection of the server chassis (even though the server chassis does not deflect more than the threshold distance). This is because interactions between sleds in a fully filled server chassis may result in additional stiffness and resistance to sagging of the server chassis due to interactions between the sleds. Thus a server chassis may have to have a higher stiffness to not deflect more than the threshold distance when a sled is removed than is required to not deflect more than the threshold distance when the server chassis is fully filled with sleds. In some embodiments, the threshold acceptable deflection distance may be designed to ensure that sleds can be freely inserted into and removed from a server chassis without server devices mounted in the sleds interfering with supports of the server chassis or other server devices mounted in the server chassis. For example, deflection of a bottom composite wall may result in server devices mounted in sleds on the bottom composite wall being oriented at a slight angle relative to vertical. However, the deflection of the composite wall may be designed such that any angling of the server devices does not interfere with inserting or removing the server devices mounted in sleds into or from the server chassis.

As discussed above, a separation between plates of a composite wall may increase a moment of inertia of the composite wall and therefore increase the stiffness of the composite wall. Accordingly, separation between plates of a composite wall reduces an amount of deflection of a server chassis comprising the composite wall as compared to a server chassis that only includes a single plate in place of a composite wall. For example, spacing devices 226, between plates 228 and 238 may function in a similar manner as a web between two plates of an "I-beam" to increase the stiffness of a composite wall, such as composite walls 202 and 204, in a similar manner as a web of an I-beam between two plates of an I-beam increases the stiffness of the I-beam.

Figure 3A:
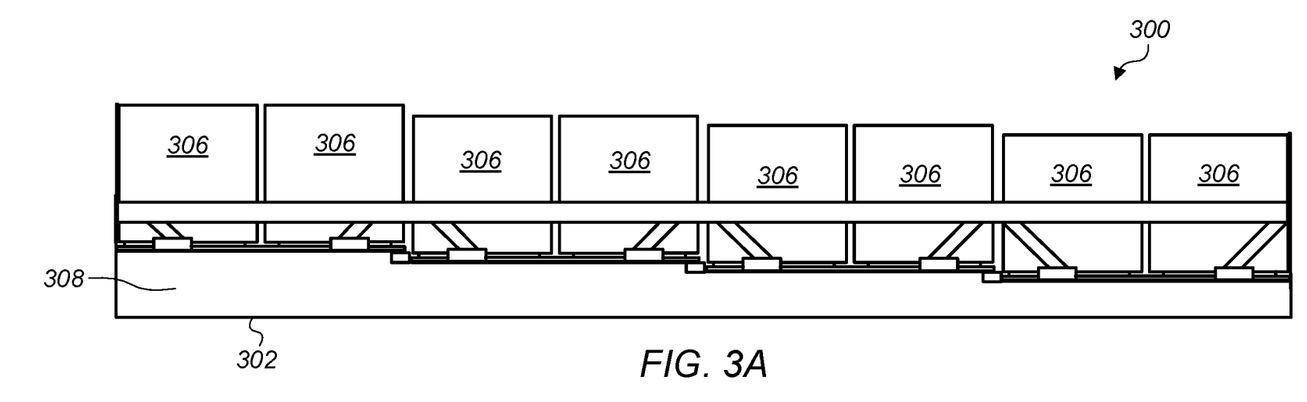
FIG. 3A is a side view of a sled with multiple server devices mounted in the sled, according to some embodiments.
Figure 3B:
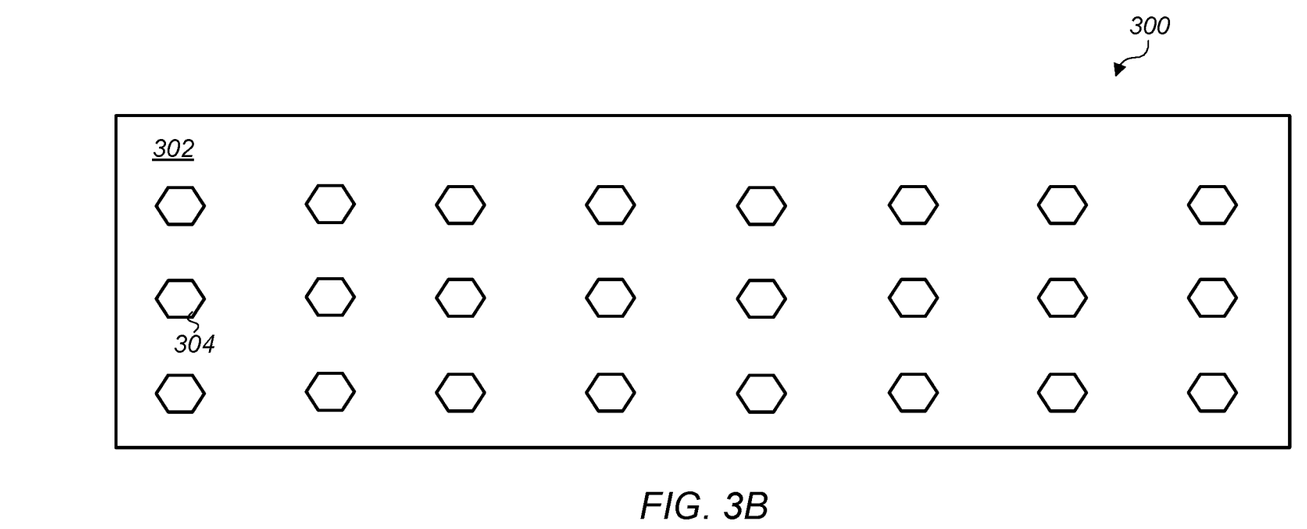
FIG. 3B is a view of a bottom side of a sled with multiple openings, according to some embodiments.

FIG. 3A is a side view of a sled with multiple server devices mounted in the sled and FIG. 3B is a view of a bottom side of the sled showing multiple openings in the sled, according to some embodiments.

In some embodiments, a sled includes openings that are configured to at least partially align with corresponding openings of a composite wall of a server chassis. For example, bottom side 302 of sled 300 includes openings 304 that may be configured to align with openings in a composite wall, such as openings 124 of bottom composite wall 106 described in FIGS. 1A-1C.

In some embodiments, server devices, such as server devices 306 mounted in sled 300 may be configured to mount at different elevations in a server chassis when sled 300 is mounted in a server chassis. In some embodiments that include server devices mounted at different elevations in a server chassis, air may flow into a server chassis in a space above a composite wall. For example air may flow into space 308 between server devices 306 and bottom side 302 of sled 300. Air flowing in a space in a sled, such as space 308, may, as the elevations of downstream server devices transition to lower elevations, flow into a composite wall below the sled. For example, air flowing in space 308 may flow through holes 304 into a composite wall, such as bottom composite wall 108 that is located below a sled. Air that has passed into a composite wall via downstream holes of a sled that are aligned with corresponding holes in a composite wall of a server chassis may subsequently flow out of the composite wall through subsequent downstream holes in the sled that align with subsequent downstream holes in a composite wall of a server chassis. The air may then flow across server devices mounted in the server chassis. FIG. 4C illustrates such an airflow.

In some embodiments, at least one plate of a composite wall may include openings arranged along a length of the composite wall. In some embodiments, a plate of a composite wall may include openings arranged along a downstream portion of the plate of the composite wall and the composite wall may not include openings in plates of the composite wall in an upstream portion of the server chassis. A composite wall with downstream opening but no upstream openings may permit air flowing in the composite wall to bypass one or more upstream server devices mounted in an upstream portion of a server chassis. The air may flow out of the composite wall via one or more downstream openings after bypassing the upstream server devices. After flowing out of the downstream openings, the air may flow across one or more downstream server devices to remove waste heat from the downstream server devices. Bypassing upstream server devices may allow non pre-heated air to arrive at downstream server devices without being heated by upstream server devices.

Figure 4A:
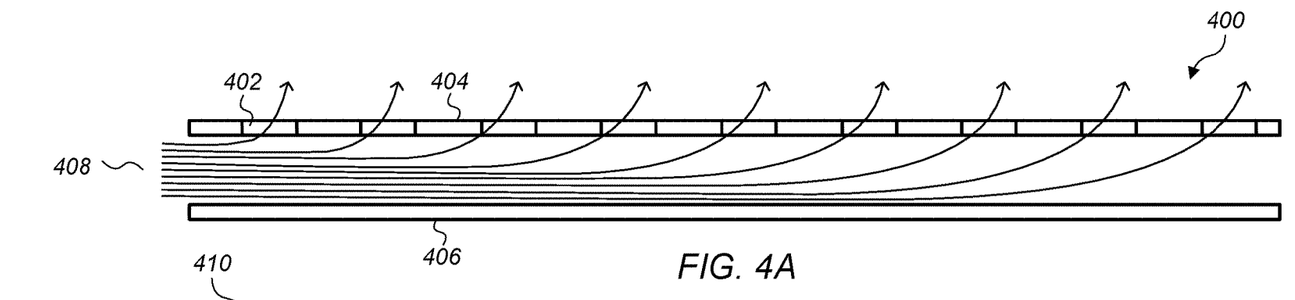
FIG. 4A is a side view of a portion of a composite wall showing air flow through the composite wall, according to some embodiments.
Figure 4B:
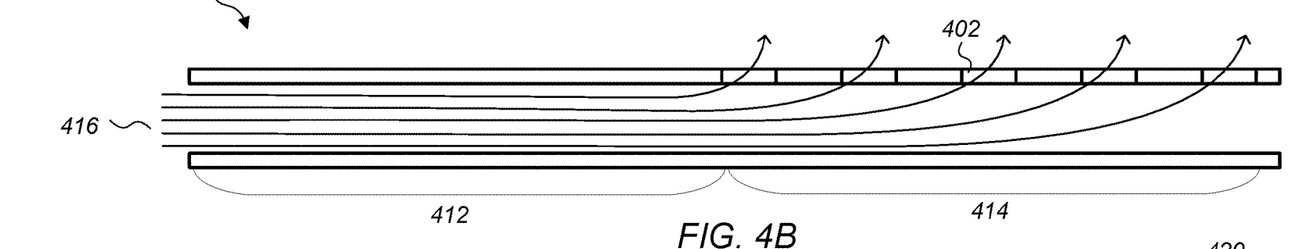
FIG. 4B is a side view of a portion of a composite wall showing air flow through the composite wall, according to some embodiments.
Figure 4C:
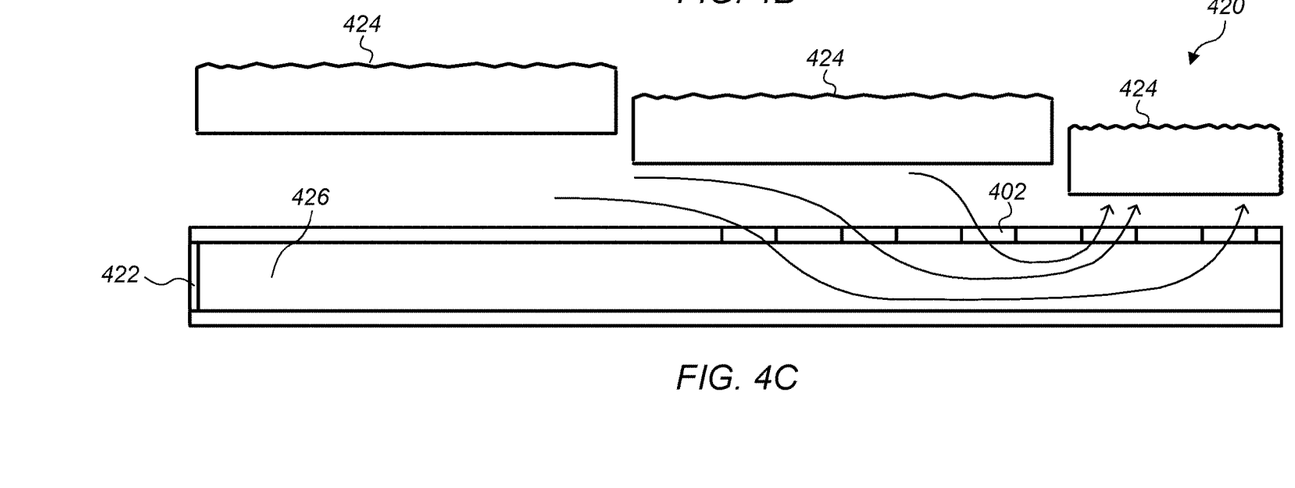
FIG. 4C is a side view of a portion of a composite wall showing air flow through the composite wall, according to some embodiments.

FIGS. 4A-4C illustrate a side view of a portion of a composite wall showing air flow through the composite wall, according to some embodiments. In FIG. 4A, composite wall 400 includes openings 402 along the length of top plate 404. Air from an air inlet of a server chassis that includes composite wall 400, such as any of the server chassis described in FIGS. 1-3, flows into an air passage 408 between top plate 404 and bottom plate 406 of composite wall 400. As air flows through air passage 408 respective portions of the air flow out of air passage 408 through respective ones of openings 402.

In some embodiments, a plate of a composite wall may not include openings in a plate of the composite wall for a first portion of the composite wall and may include openings in a plate of the composite wall in another portion of the composite wall. For example, composite wall 410 illustrated in FIG. 4B does not include openings in top plate 404 or bottom plate 406 in portion 412 of composite wall 410 and does include openings 402 in portion 414 of composite wall 410. Air may flow through air passage 416 of composite wall 410 and bypass server devices mounted above portion 412 of composite wall 410. The air flowing through air passage 416 may then flow out of air passage 416 via openings 402 downstream of portion 412. The air flowing out of air passage 416 may remove waste heat from server devices mounted above portion 414 of composite wall 410 without being pre-heated by server devices mounted above portion 412.

In some embodiments, an air passage of a composite wall may be at least partially restricted at an air inlet side of a server chassis. For example, in FIG. 4C composite wall 420 includes cap 422 at an inlet side of the composite wall. In some embodiments, a cap, such as cap 422, may be configured to guide sleds into a server chassis and may only partially restrict air flow into an air passage of a composite wall. In FIG. 4C, air flows above composite wall 420 between server devices 424 and composite wall 420. In some embodiments, server devices 424 may be mounted in a sled such as sled 300 described in FIGS. 3A-3B. As the elevations of respective ones of the server devices mounted above a composite wall, such as composite wall 420, are reduced a portion of the air flowing through the server chassis above the composite wall may flow down into an air passage of the composite wall, such as air passage 426 of composite wall 400. Air flowing through an air passage of a composite wall, such as air passage 426, may subsequently flow out of the air passage and across one or more server devices mounted above the composite wall via one or more openings in an upper plate of the composite wall. For example, air may flow out of air passage 426 and across server devices 424 that are positioned at lower elevations in a server chassis.

While air flow has been illustrated in FIGS. 4A-4C as flowing from a front of a server chassis to a back of a server chassis, those of skill in the art will appreciate that air could flow from back to front or in other directions through a composite wall of a server chassis, such as any of the composite walls described in FIGS. 1-4. Also, similar opening arrangements as those described above in regard to FIGS. 4A-4C could also be used for an upper composite wall that receives air that has passed across server devices and permits the air to flow via air passages of the upper composite wall to an air outlet side of a server chassis.

Figure 5A:
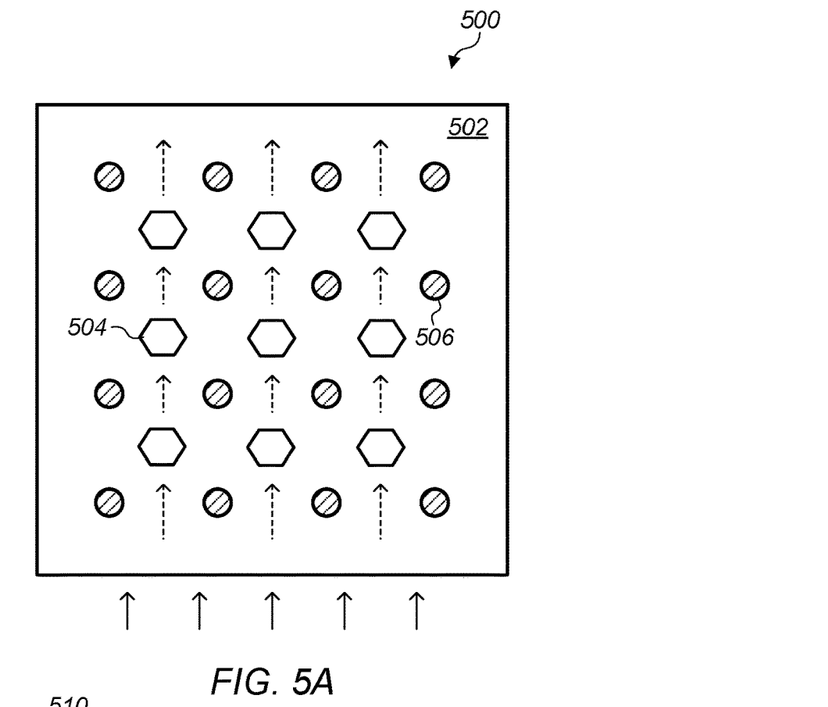
FIG. 5A is a top view of a composite wall with openings arranged in a grid pattern, according to some embodiments.
Figure 5B:
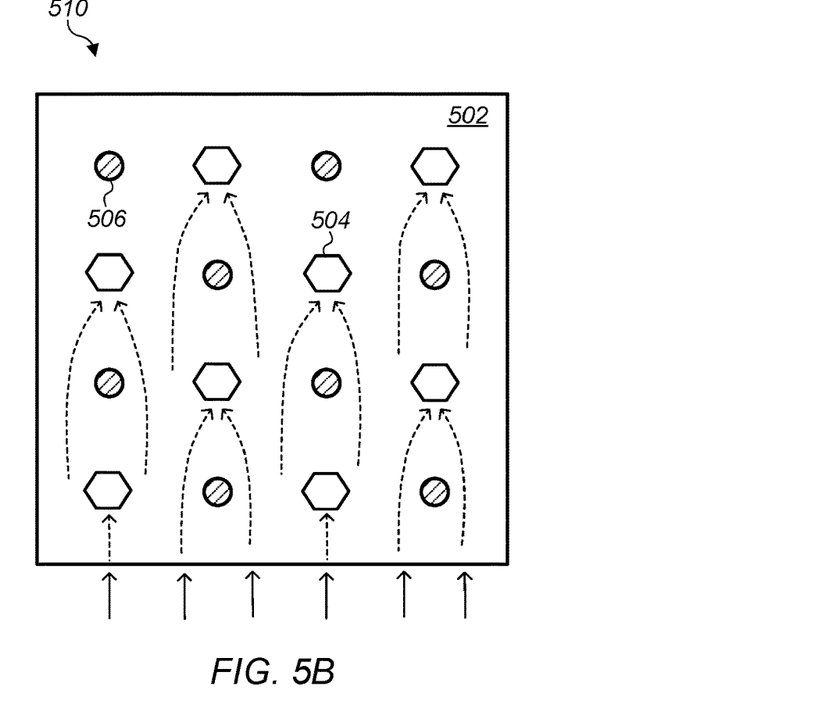
FIG. 5B is a top view of a composite wall with openings arranged in a honeycomb pattern, according to some embodiments.

In some embodiments, various arrangements of openings in a plate of a composite wall and various arrangements of spacing devices may be utilized for a composite wall. For example, FIG. 5A illustrates a top view of a composite wall with openings arranged in a grid pattern, according to some embodiments, and FIG. 5B illustrates a top view of a composite wall with openings arranged in a honeycomb pattern, according to some embodiments. In FIG. 5A, top plate 502 of composite wall 500 includes openings 504 arranged in a grid pattern and spacing devices 506 arranged in a grid pattern that is offset from openings 504. In such an arrangement, air may flow through a composite wall, such as composite wall 500, via air passages between spacing devices that align with openings above the air passages. This may allow air to flow to the openings of the composite wall without being impeded by spacing devices, such as spacing devices 506. In some embodiments, a composite wall may include spacing devices arranged in a grid pattern and openings arranged in a honeycomb pattern. In some embodiments, a composite wall may include spacing devices arranged in a honeycomb pattern and openings arranged in a grid pattern. In some embodiments, a composite wall may include other combinations of arrangements of spacing devices and openings.

In some embodiments, spacing devices may be located adjacent to openings in a plate of a composite wall to influence air to flow through the opening in the plate of the composite wall. For example, in FIG. 5B, composite wall 510 includes openings 504 arranged in a honeycomb pattern with spacing devices 506 also arranged in a honeycomb pattern. In some embodiments, a spacing device may be located downstream of an opening and may cause a restriction to flow that causes air flowing in an air passage upstream of the spacing device to be diverted up into an opening in a plate of a composite wall that includes the air passage and out of the air passage. In some embodiments, spacing devices and openings may be arranged in a non-uniform arrangement. For example, in some embodiments, a particular portion of a server chassis may comprise server devices that generate more waste heat than server devices located in other portions of the server chassis. Such server chassis may include an uneven distribution of openings and/or spacing devices configured to preferentially direct air flowing through an air passage of a composite wall included in the server chassis to flow to the portion of the server chassis that includes server devices that generate more waste heat than the other server devices in other portions of the server chassis.

A composite wall may include various types of spacing devices. For example, in some embodiments a composite wall may include a stand-off style spacing device or an ant-hill style spacing device that separates plates of the composite wall.

Figure 6:
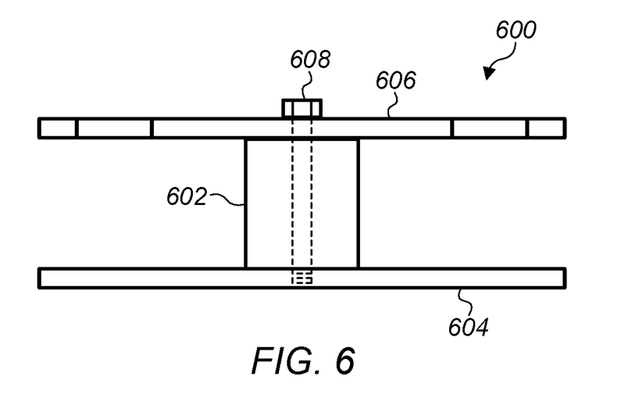
FIG. 6 is a side view of a cutaway of a composite wall comprising a stand-off style spacing device, according to some embodiments.

FIG. 6 is a side view of a cutaway of a composite wall comprising a stand-off style spacing device, according to some embodiments. A stand-off style spacing device may include a spacing element, such as spacing element 602, positioned between plates of a composite wall, such as plates 604 and 606 of composite wall 600. A fastener, such as fastener 608, may secure a spacing element, such as spacing element 602, and plates, such as plates 604 and 606, together. In some embodiments, a fastener, such as fastener 608, may be a screw, rivet, bolt, or other suitable fastener.

Figure 7:
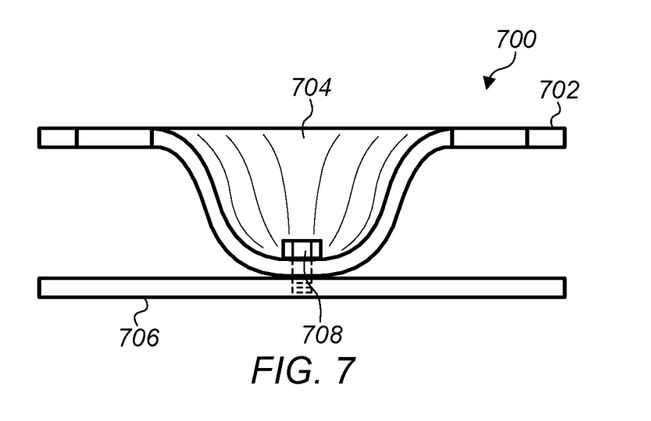
FIG. 7 is a side view of a cutaway of a composite wall comprising an ant hill style spacing device, according to some embodiments.

FIG. 7 is a side view of a cutaway of a composite wall comprising an ant hill style spacing device, according to some embodiments. An ant-hill spacing device may include a portion of a plate, such as plate 702 of composite wall 700, that is depressed outward from the plate, such as plate 702. The depressed portion of the plate, such as portion 704, may couple with another plate of the composite wall, such as plate 706 of composite wall 700. The depressed portion of the plate may couple with the other plate to separate the two plates. In some embodiments, a fastener, such as fastener 708, may be used to secure a depressed portion of a plate with an adjacent plate of a composite wall. In some embodiments, a depressed portion of a plate may be welded or soldered to an adjacent plate of a composite wall. In some embodiments, adjacent plates of a composite wall may both include depressed portions that separate the adjacent plates. For example, plate 706 may include depressed portions such as depressed portion 704.

Figure 8:
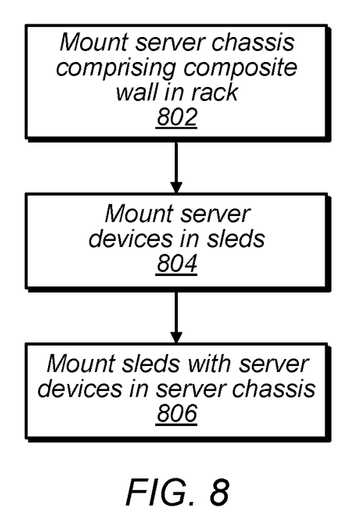
FIG. 8 illustrates a method of installing a server system in a rack, according to some embodiments.

FIG. 8 illustrates a method of installing a server system in a rack, according to some embodiments.

At 802, a server chassis comprising a composite wall is mounted in a rack. In some embodiments, a server chassis comprising a composite wall may mount on rails of a rack or may mount on a shelf of a rack. In some embodiments, a server chassis comprising a composite wall may mount in a rack in any other suitable manner. The server chassis may include a bottom composite wall, a top composite wall, or both. In some embodiments, a server chassis may include one or more side composite walls. A composite wall of a server chassis may include openings configured to at least partially align with sleds that are to be installed in the server chassis. In some embodiments, server devices and server components may be mounted in a server chassis without sleds and openings in a composite wall of a server chassis may be configured to align with server devices and server components that are to be directly mounted on the composite wall.

At 804, server devices are mounted in sleds. In some embodiments, this server devices may be mounted directly in a server chassis without sleds. In some embodiments, server devices may include processor server devices and mass storage server devices. A sled may include one or more backplanes that couple a group of server devices mounted in the sled together such that the server devices can communicate with one another. In some embodiments, a sled comprising at least one processor server device and one or more mass storage server devices may function as a logical node.

At 806, sleds that include server devices mounted in the sleds are mounted in the server chassis that has been mounted in the rack. In some embodiments a server chassis may be configured to accept multiple sleds of server devices. Also, a server chassis may be configured such that individual sleds of server devices can be inserted into the server chassis and removed from the server chassis without removing other sleds of server devices mounted in the server chassis.

Figure 9:
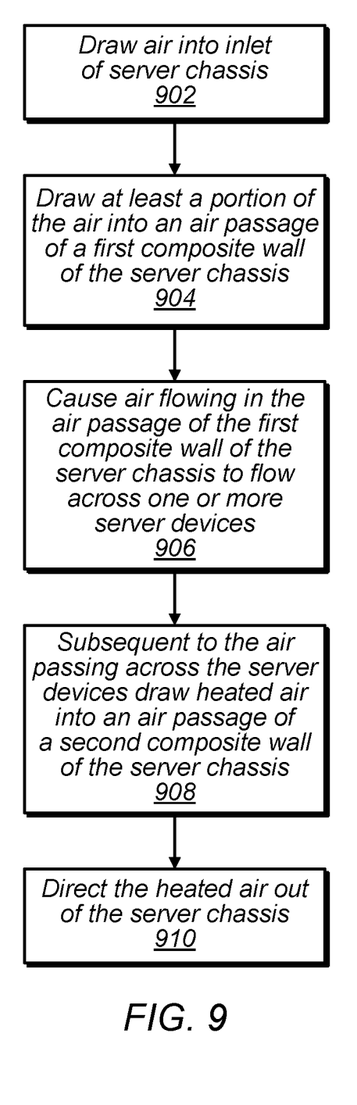
FIG. 9 illustrates a method of cooling server devices of a server system, according to some embodiments.

FIG. 9 illustrates a method of cooling server devices of a server system, according to some embodiments. At 902 air is drawn into an inlet of a server chassis. In some embodiments a server chassis may include one or more fans that cause air to be drawn into the server chassis. In some embodiments, air moving devices may be external to a server chassis and may be coupled to the server chassis to cause air to be drawn into the server chassis. In some embodiments, an air passage of a composite wall of a server chassis may be connected to an air inlet of the server chassis or may be in fluid communication with the air inlet of the server chassis.

At 904, at least a portion of the air drawn into the air inlet of the server chassis is drawn into one or more air passages of a composite wall of the server chassis. In some embodiments a large portion of the air drawn into a server chassis may flow into an air passage of a composite wall. In some embodiments, a portion of air drawn into a server chassis may flow across server devices mounted in the server chassis without flowing into an air passage of a composite wall, and another portion of the air drawn into the server chassis may flow into one or more air passages of a composite wall of the server chassis.

At 906, air flowing in the one or more air passages of the composite wall is caused to flow across one or more server devices mounted in the server chassis. The air drawn into the air passages of the composite wall of the server chassis at 904 may flow along a length of the server chassis via the one or more air passages of the composite wall and may subsequently flow out of the one or more air passages via one or more openings and flow across server devices mounted in the server chassis. In some embodiments, server devices mounted in a server chassis may be cooled by air that flows directly across the server devices from an air inlet of the server chassis and may additionally be cooled b air that flows across the server devices from one or more openings in a plate of a composite wall of the server chassis.

At 908, subsequent to the air passing across the server devices to remove waste heat from the server devices, the air is drawn into one or more air passages of a second composite wall of the server chassis. For example, the first composite wall and the second composite wall may be on opposite sides of server devices mounted in the server chassis so that air flows out of openings in the first composite wall, across the server devices mounted in the server chassis, and flows into the second composite wall via openings in a plate of the second composite wall. In some embodiments, a server chassis may include a single composite wall and step 908 may be omitted.

At 910, air that has passed across server devices to remove waste heat from the server devices is directed out of the server chassis. For example, air that was drawn into the second composite wall at 908 may flow through one or more air passages of the second composite wall to an outlet of the server chassis. In some embodiments, air that has removed waste heat from server devices may flow to an outlet of the server chassis without flowing through a second composite wall.

In some embodiments, server devices, such as mass storage devices in a server system are standard, off-the-shelf hard disk drives. Examples of suitable hard disk drive form factors may include 3.5", 5.25", and 2.5". In one embodiment, a standard 3.5" hard disk drive is installed in a sled with other standard 3.5" hard disk drives. In some embodiments, a server device installed in a sub-node chassis may have a form factor equivalent to a 2.5", 3", 3.5", or 5.25" hard disk drive.

Although in the embodiments described above, some of the server systems have been described as being 3 U, 4 U, or 5 U in height, server systems may in various embodiments be 2 U, 4 U, 5 U, 6 U or any other height or dimensions.

The various methods as illustrated in the figures and described herein represent example embodiments of methods. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A server system, comprising:
   a server chassis comprising multiple chassis walls;
   sleds mounted in the server chassis, wherein the sleds are configured to slide at least partially out of the server chassis and into the server chassis; and
   server devices mounted in respective ones of the sleds,
   wherein one chassis wall of the multiple chassis walls is a composite wall comprising:
      two plates;
      a plurality of spacing devices arranged between the two plates to provide structural stiffness for the server chassis, wherein at least a portion of the plurality of spacing devices are located at interior positions within the composite wall away from a front edge, a back edge, and side edges of the composite wall; and
      an air passage between the two plates,
   wherein the server chassis is configured to permit air to flow from an air inlet side of the server chassis to the server devices mounted in the sleds via the air passage of the composite wall.

2. The server system of claim 1, wherein:
   the composite wall comprises an opening in one of the plates;
   one of the sleds comprises an opening in a surface of the one sled; and
   the opening in the plate and the opening in the surface of the one sled are configured to:
      at least partially align with each other; and
      permit air to flow between the air passage of the composite wall and the server devices mounted in the one sled.

3. The server system of claim 1, wherein an additional one of the multiple chassis walls is a composite wall, wherein the composite walls are configured to:
   permit air to flow from the air inlet side of the server chassis to server devices in the server chassis via an air passage of a first one of the composite walls; and
   permit the air to flow, subsequent to passing across the server devices, to an air outlet side of the server chassis via an air passage of a second one of the composite walls.

4. The server system of claim 1, wherein:
   the composite wall comprises downstream openings downstream of upstream server devices in the server chassis; and
   the air passage of the composite wall is configured such that the air in the air passage bypasses the upstream server devices and flows out of the air passage and across downstream server devices in the server chassis via the downstream openings.

5. The server system of claim 1, wherein the server chassis is further configured such that a portion of an airflow from the air inlet side of the server chassis flows into the air passage of the composite wall, and another portion of the airflow from the air inlet side of the server chassis flows across server devices in the server chassis without flowing into the air passage of the composite wall.

6. An apparatus, comprising:
   a server chassis comprising multiple walls,
   wherein the server chassis is configured to accept one or more sleds that least partially slide into or out of the server chassis, and
   wherein at least one wall of the multiple walls of the server chassis is a composite wall comprising:
      two plates;
      a plurality of spacing devices arranged between the two plates to provide structural stiffness for the server chassis, wherein at least a portion of the plurality of spacing devices are located at interior positions within the composite wall away from a front edge, a back edge, and side edges of the composite wall; and
      an air passage between the two plates.

7. The apparatus of claim 6, wherein the composite wall further comprises an opening in one of the plates,
   wherein the server chassis is configured to permit air to flow, via the air passage of the composite wall and via the opening, from an air inlet side of the server chassis to server devices of the one or more sleds mounted in the server chassis.

8. The apparatus of claim 7, wherein the opening in the plate is configured to at least partially align with an opening in one of the one or more sleds mounted in the server chassis.

9. The apparatus of claim 7, wherein the opening in the plate is located in a downstream portion of the server chassis, downstream from server devices mounted in an upstream portion of the server chassis,
   wherein the air passage is configured such that an airflow in the air passage bypasses the server devices mounted in the upstream portion of the server chassis.

10. The apparatus of claim 6, wherein the composite wall further comprises multiple openings arranged in a grid pattern or in a honeycomb pattern.

11. The apparatus of claim 6, wherein the server chassis comprises a first composite wall and a second composite wall,
    wherein the server chassis is configured to:
       permit air to flow into the first composite wall from an air inlet side of the server chassis;
       permit the air to flow from the first composite wall across one or more server devices of the sleds mounted in the server chassis; and
       permit the air to flow from the one or more server devices to an air outlet side of the server chassis via the second composite wall.

12. The apparatus of claim 6, wherein the air passage comprises an air plenum having a height that spans from a top surface of a first one of the two plates to a bottom surface of a second one of the two plates.

13. The apparatus of claim 12, wherein respective ones of the spacing devices are:
   arranged proximate to respective openings in one of the two plates; and
   configured to accept a portion of an airflow in the air passage that is diverted by the spacing device such that the portion of the airflow diverted by the spacing device flows through the opening proximate to the spacing device.

14. The apparatus of claim 6, wherein respective ones of the spacing devices comprise:
   a spacing element positioned between the two plates; or
   a portion of one of the two plates configured such that the portion extends into the air passage between the two plates to separate the two plates.

15. The apparatus of claim 6, wherein the server chassis comprises server devices mounted in the server chassis at different elevations in the server chassis, and
   wherein the air passage is configured such that an airflow above the composite wall is permitted to flow into the air passage of the composite wall for at least a portion of a length of the server chassis due to elevation differences of the server devices mounted in the server chassis.

16. The apparatus of claim 6, wherein the server chassis comprises an upper composite wall or a lower composite wall and does not include a front wall,
   wherein the server chassis is configured to support multiple sleds each comprising server devices mounted in the respective sleds without the upper composite wall or the lower composite wall deflecting more than a threshold amount of deflection.

17. The apparatus of claim 16, wherein the server chassis is further configured to not deflect more than the threshold amount of deflection when one of the sleds is removed from the server chassis.

18. A method, comprising:
   mounting a server chassis in a rack computer system, wherein the server chassis comprises a composite wall comprising:
      two plates;
      a plurality of spacing devices arranged between the two plates to provide structural stiffness for the server chassis, wherein at least a portion of the plurality of spacing devices are located at interior positions within the composite wall away from a front edge, a back edge, and side edges of the composite wall; and
      an air passage between the two plates; and
   sliding one or more sleds into, or out of, the server chassis.

19. The method of claim 18 further comprising:
   drawing air from an air inlet side of the server chassis into the air passage of the composite wall; and
   causing the air drawn into the air passage to flow out of the air passage and across a server device mounted in one of the one or more sleds in the server chassis.

20. The method of claim 19, further comprising:
   drawing a portion of the air, subsequent to flowing across the server device, into another air passage of another composite wall of the server chassis; and
   directing the air drawn into the other air passage out of the server chassis.

* * * * *